US009917198B2

(12) United States Patent
Xie (10) Patent No.: US 9,917,198 B2
(45) Date of Patent: Mar. 13, 2018

(54) ARRAY SUBSTRATE, MANUFACTURING METHOD THEREOF AND DISPLAY DEVICE (71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 14 days.

(21) Appl. No.: 14/769,765

(22) PCT Filed: Feb. 12, 2015

(86) PCT No.: PCT/CN2015/072901
§ 371 (c)(1),
(2) Date: Aug. 21, 2015

(87) PCT Pub. No.: WO2016/061961
PCT Pub. Date: Apr. 28, 2016

(65) Prior Publication Data
US 2016/0260840 A1 Sep. 8, 2016

(30) Foreign Application Priority Data
Oct. 22, 2014 (CN) .......................... 2014 1 0566635

(51) Int. Cl.
*H01L 29/786* (2006.01)
*H01L 29/06* (2006.01)
(Continued)

(52) U.S. Cl.
CPC .... *H01L 29/78609* (2013.01); *H01L 29/0615* (2013.01); *H01L 29/1041* (2013.01);
(Continued)

(58) Field of Classification Search
CPC .......... H01L 29/6675; H01L 29/66757; H01L 29/0615; H01L 29/78621; H01L 29/78609; H01L 29/78696; H01L 29/1041
See application file for complete search history.

(56) References Cited

U.S. PATENT DOCUMENTS

2002/0125535 A1* 9/2002 Ueda ................ H01L 29/66757
257/347
2003/0089911 A1* 5/2003 Kasahara .......... H01L 21/02532
257/72
(Continued)

FOREIGN PATENT DOCUMENTS

CN 1198596 A 11/1998
CN 1523413 A 8/2004
(Continued)

OTHER PUBLICATIONS

First Office Action regarding Chinese application No. 201410566635.8, dated Aug. 2, 2016. Translation provided by Dragon Intellectual Property Law Firm.
(Continued)

*Primary Examiner* — Phat X Cao
*Assistant Examiner* — Diana C Vieira
(74) *Attorney, Agent, or Firm* — Harness, Dickey & Pierce, P.L.C.

(57) ABSTRACT

The present disclosure provides an array substrate, a manufacturing method thereof and a display device. The array substrate includes an active layer, a gate insulating layer and a gate electrode layer formed sequentially on a base substrate. The active layer includes a first heavily-doped region, a first lightly-doped region, a first non-doped region, a second lightly-doped region, a second non-doped region, a third lightly-doped region and a second heavily-doped region which are sequentially arranged in a horizontal direction.

15 Claims, 7 Drawing Sheets (51) Int. Cl.
*H01L 27/12* (2006.01)
*H01L 29/10* (2006.01)
(52) U.S. Cl.
CPC .. *H01L 29/78621* (2013.01); *H01L 29/78627* (2013.01); *H01L 29/78675* (2013.01); *H01L 29/78696* (2013.01); H01L 27/1214 (2013.01); H01L 29/78618 (2013.01); H01L 29/78645 (2013.01); H01L 2029/7863 (2013.01)

(56) References Cited

U.S. PATENT DOCUMENTS

| | | | |
|---|---|---|---|
| 2005/0167662 A1* | 8/2005 | Nakamura | H01L 27/1214 257/59 |
| 2007/0051956 A1 | 3/2007 | Shih et al. | |
| 2007/0200139 A1 | 8/2007 | Shibata et al. | |
| 2010/0032674 A1* | 2/2010 | Noda | G02F 1/13624 257/59 |

FOREIGN PATENT DOCUMENTS

| | | | |
|---|---|---|---|
| CN | 101644865 A | 2/2010 | |
| CN | 104282696 A | 1/2015 | |
| CN | 204130536 U | 1/2015 | |
| JP | 02206173 A * | 8/1990 | ....... H01L 29/42384 |

OTHER PUBLICATIONS

Written Opinion of the International Searching Authority for international application No. PCT/CN2015/072901.
Third Office Action regarding Chinese Application No. 201410566635.8, dated Aug. 14, 2017. Translation provided by Dragon Intellectual Property Law Firm.

* cited by examiner

Fig. 3 forming patterns of the active layer, the gate insulating layer and the gate electrode layer sequentially on the base substrate, the active layer including the first heavily-doped region, the first lightly-doped region, the first non-doped region, the second lightly-doped region, the second non-doped region, the third lightly-doped region and the second heavily-doped region sequentially arranged in a horizontal direction

ARRAY SUBSTRATE, MANUFACTURING METHOD THEREOF AND DISPLAY DEVICE

CROSS-REFERENCE TO RELATED APPLICATION

The present application is the U.S. national phase of PCT Application No. PCT/CN2015/072901 filed on Feb. 12, 2015, which claims a priority of the Chinese patent application No. 201410566635.8 filed on Oct. 22, 2014, which is incorporated herein by reference in its entirety.

TECHNICAL FIELD

The present disclosure relates to the field of display technology, in particular to an array substrate, a manufacturing method thereof and a display device.

BACKGROUND

Low temperature poly-silicon (LTPS) technique is a new process for manufacturing a thin film transistor (TFT) display device, and an LTPS TFT display device may provide an image with well display quality due to its rapid response and high resolution. When the LTPS technique is adopted for forming a peripheral circuit of the display device, the number of integrated circuits (ICs) can be reduced and a structure at a periphery of the display device can be simplified, thereby providing a narrow-bezel product.

Although with great development in the LTPS technique, there still exist some defects for the LTPS TFT, i.e., it is impossible to effectively suppress the occurrence of a leakage current, and excessive heat will be generated. The excessive heat is generated by the LTPS TFT due to impact ionization caused by electrons accelerated under the effect of a relatively large horizontal electric field of the LTPS TFT. Because of the excessive heat, lattice scattering will occur, so metal ions, e.g., $Na^+$, in a glass substrate will be diffused toward an active region and thereby a threshold voltage (Vth) of the LTPS TFT will be adversely affected. In addition, a negative resistance effect will occur at a saturation region, so the carrier mobility and the on-state current will be reduced. Furthermore, when the excessive heat is generated for a long period of time, the characteristics of the LTPS TFT will be deteriorated and the product quality will be adversely affected.

It has been found through research that it is possible to effectively reduce the generated heat as well as the leakage current by forming the active region of the LTPS TFT to incorporate a lightly-doped drain (LDD). Since the LDD has a relatively high resistance, which is equivalent to a serially-connected resistor of high resistance, the intensity of the horizontal electric field of the LTPS TFT can be reduced, and the distribution of the electric field in a channel of the LTPS TFT can be improved, thereby reducing the generated hot carriers due to impact ionization caused by electric field acceleration and effectively suppressing the occurrence of the leakage current.

However, there is such a dilemma in the related art that, the LDD will lose its capability to reduce the generated heat and suppress the leakage current when the LDD is too short, but the power consumption of the LTPS TFT will be increased and an aperture ratio of the display device will be adversely affected when the LDD is too long.

SUMMARY

The present disclosure provides an array substrate, a manufacturing method thereof and a display device, so as to effectively reduce the heat generated by an LTPS TFT and suppress the occurrence of leakage current thereof while ensuring an aperture ratio.

In one aspect, the present disclosure provides in one embodiment an array substrate, including an active layer, a gate insulating layer and a gate electrode layer formed sequentially on a base substrate. The active layer includes a first heavily-doped region, a first lightly-doped region, a first non-doped region, a second lightly-doped region, a second non-doped region, a third lightly-doped region and a second heavily-doped region which are sequentially arranged in a horizontal direction.

Alternatively, the second lightly-doped region is arranged in a middle of the active layer in the horizontal direction.

Alternatively, a projection of a pattern of the gate electrode layer onto the array substrate covers projections of the first lightly-doped region, the first non-doped region, the second lightly-doped region, the second non-doped region and the third lightly-doped region onto the array substrate.

Alternatively, the pattern of the gate electrode layer includes a pattern of a first gate electrode and a pattern of a second gate electrode. A projection of the pattern of the first gate electrode onto the array substrate covers a projection of the first non-doped region onto the array substrate, and a projection of the pattern of the second gate electrode onto the array substrate covers a projection of the second non-doped region onto the array substrate.

Alternatively, the array substrate further includes a first insulating layer arranged between the base substrate and the active layer.

Alternatively, the array substrate further includes: a second insulating layer arranged on the gate insulating layer and the gate electrode layer; a source-drain electrode layer arranged on the second insulating layer, the source-drain electrode layer including a source electrode line electrically connected to the first heavily-doped region through a first via-hole passing through the second insulating layer and the gate insulating layer, and a drain electrode line electrically connected to the second heavily-doped region through a second via-hole passing through the second insulating layer and the gate insulating layer; a passivation layer arranged on the source-drain electrode layer; and a pixel electrode layer arranged on the passivation layer and electrically connected to the drain electrode line through a third via-hole in the passivation layer.

Alternatively, the array substrate further includes a protection layer arranged on the passivation layer and the pixel electrode layer, and a common electrode layer arranged on the protection layer.

Alternatively, the first lightly-doped region, the second lightly-doped region and the third lightly-doped region are each of a length of about 1 μm to about 3 μm, and an ion injection concentration for each of the first lightly-doped region, the second lightly-doped region and the third lightly-doped region is about $5 \times 10^{11}$ ions/cm$^2$ to about $1 \times 10^{14}$ ions/cm$^2$.

Alternatively, an ion injection concentration for each of the first heavily-doped region and the second heavily-doped region is about $1 \times 10^{14}$ ions/cm$^2$ to about $1.5 \times 10^{20}$ ions/cm$^2$, and the first heavily-doped region and the second heavily-doped region are each of a length of about 2 μm to about 5 μm.

In another aspect, the present disclosure provides in one embodiment a method for manufacturing an array substrate, including: forming patterns of an active layer, a gate insulating layer and a gate electrode layer sequentially on a base substrate. The active layer includes a first heavily-doped region, a first lightly-doped region, a first non-doped region, a second lightly-doped region, a second non-doped region, a third lightly-doped region and a second heavily-doped region which are sequentially arranged in a horizontal direction.

Alternatively, the second lightly-doped region is arranged in a middle of the active layer in the horizontal direction.

Alternatively, the step of forming the patterns of the active layer, the gate insulating layer and the gate electrode layer sequentially on the base substrate includes: depositing an a-Si film onto the base substrate, and after the a-Si film is crystallized, forming silicon islands of the active layer by a patterning process; applying a photoresist onto the silicon islands, and forming a plurality of gaps in the photoresist by a patterning process in such a manner that the plurality of gaps are located above positions in the silicon islands where the first lightly-doped region, the second lightly-doped region and the third lightly-doped region are located, respectively; injecting ions at the positions in the silicon islands where the first lightly-doped region, the second lightly-doped region and the third lightly-doped region are located, respectively, through the plurality of gaps, thereby forming the first lightly-doped region, the second lightly-doped region and the third lightly-doped region of the active layer; depositing a gate insulating layer film and a gate electrode layer film sequentially onto the silicon islands, and forming the patterns of gate insulating layer and the gate electrode layer by a patterning process, a projection of the pattern of the gate electrode layer onto the array substrate covering projections of the first lightly-doped region, the first non-doped region, the second lightly-doped region, the second non-doped region and the third lightly-doped region onto the array substrate; and injecting ions at positions in the silicon islands where the first heavily-doped region and the second heavily-doped region are located, respectively, thereby forming the first heavily-doped region and the second heavily-doped region at the active layer.

Alternatively, the step of forming the patterns of the active layer, the gate insulating layer and the gate electrode layer sequentially on the base substrate further includes: depositing an a-Si film onto the base substrate, and after the a-Si film is crystallized, forming silicon islands of the active layer by a patterning process; applying a photoresist onto the silicon islands, and etching off the photoresist above positions in the silicon islands where the first heavily-doped region and the second heavily-doped region are located, respectively; injecting ions at the positions in the silicon islands where the first heavily-doped region and the second heavily-doped region are located, respectively, thereby forming the first heavily-doped region and the second heavily-doped region of the active layer; depositing a gate insulating layer film and a gate electrode layer film sequentially onto the silicon islands, and forming the patterns of the gate insulating layer and the gate electrode layer by a patterning process, the pattern of the gate electrode layer including a pattern of a first gate electrode and a pattern of a second gate electrode, a projection of the pattern of the first gate electrode onto the array substrate covering a projection of the first non-doped region onto the array substrate, and a projection of the pattern of the second gate electrode onto the array substrate covering a projection of the second non-doped region onto the array substrate; and injecting ions at positions in the silicon islands where the first lightly-doped region, the second lightly-doped region and the third lightly-doped region are located, respectively, through the pattern of the gate insulating layer, thereby forming the first lightly-doped region, the second lightly-doped region and the third lightly-doped region at the active layer.

Alternatively, before applying the photoresist onto the silicon islands, the step of forming the patterns of the active layer, the gate insulating layer and the gate electrode layer sequentially onto the base substrate further includes injecting ions into the silicon islands.

Alternatively, before the step of forming the patterns of the active layer, the gate insulating layer and the gate electrode layer sequentially onto the base substrate, the method further includes forming a pattern of a first insulating layer on the base substrate, the pattern of the active layer being arranged on the first insulating layer.

Alternatively, the method further includes: forming a pattern of a second insulating layer on the gate insulating layer and the gate electrode layer; forming a first via-hole and a second via-hole in the second insulating layer and the gate insulating layer in such a manner that the first via-hole is located above the first heavily-doped region, and the second via-hole is located above the second heavily-doped region; forming a source-drain electrode layer on the second insulating layer, the source-drain electrode layer including a source electrode line electrically connected to the first heavily-doped region through the first via-hole, and a drain electrode line electrically connected to the second heavily-doped region through the second via-hole; forming a pattern of a passivation layer on the source-drain electrode layer, the pattern of the passivation layer being provided with a third via-hole; and forming a pattern of a pixel electrode layer on the passivation layer, the pixel electrode layer being electrically connected to the drain electrode line through the third via-hole.

Alternatively, the method further includes: forming a pattern of a protection layer on the passivation layer and the pixel electrode layer; and forming a pattern of a common electrode layer on the protection layer.

Alternatively, the first lightly-doped region, the second lightly-doped region and the third lightly-doped region are each of a length of about 1 μm to about 3 μm, and an ion injection concentration for each of the first lightly-doped region, the second lightly-doped region and the third lightly-doped region is about $5\times10^{11}$ ions/cm$^2$ to about $1\times10^{14}$ ions/cm$^2$.

Alternatively, an ion injection concentration for each of the first heavily-doped region and the second heavily-doped region is about $1\times10^{14}$ ions/cm$^2$ to about $1.5\times10^{20}$ ions/cm$^2$, and the first heavily-doped region and the second heavily-doped region are each of a length of about 2 μm to about 5 μm.

In yet another aspect, the present disclosure provides in one embodiment a display device including the above-mentioned array substrate.

According to the array substrate, the manufacturing method thereof and the display device in the embodiments of the present disclosure, the active layer, the gate insulating layer and the gate electrode layer are sequentially on the base substrate of the array substrate, and the active layer includes the first heavily-doped region, the first lightly-doped region, the first non-doped region, the second lightly-doped region, the second non-doped region, the third lightly-doped region and the second heavily-doped region which are sequentially arranged in the horizontal direction. As a result, it is possible to effectively reduce the heat generated by an LTPS TFT and suppress the occurrence of leakage current thereof while ensuring an aperture ratio.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
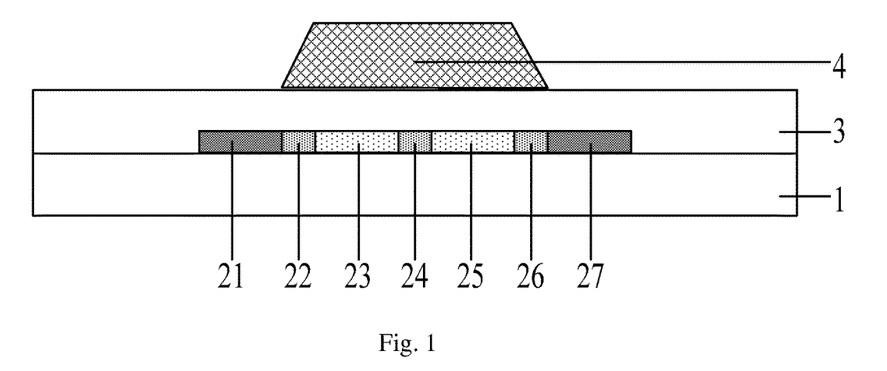
FIG. 1 is a schematic view showing an array substrate according to one embodiment of the present disclosure.

The present disclosure provides in one embodiment an array substrate. As shown in FIG. 1, the array substrate may include an active layer, a gate insulating layer 3 and a gate electrode layer 4 formed sequentially on a base substrate 1. The active layer includes a first heavily-doped region 21, a first lightly-doped region 22, a first non-doped region 23, a second lightly-doped region 24, a second non-doped region 25, a third lightly-doped region 26 and a second heavily-doped region 27 which are sequentially arranged in a horizontal direction.

According to the array substrate in the embodiment of the present disclosure, a plurality of lightly-doped regions each having a high resistance is arranged in a middle of a channel region of a TFT and at predetermined positions at two sides of the channel region, respectively, so as to reduce an acceleration distance of electrons under the effect of an electric field, and reduce kinetic energy of the electrons and the hot carriers generated by the impact of ions, thereby effectively reducing the heat generated by the LTPS TFT and effectively suppressing the occurrence of a leakage current.

As shown in FIG. 1, the second lightly-doped region 24 may be arranged in the middle of the active layer in a horizontal direction. In this way, when electrons are transmitted through the two non-doped regions, the electrons certainly pass through the second lightly-doped region 24, and thus the transmission speed and the kinetic energy of the electrons may be reduced, thereby reducing the generated heat and suppressing the occurrence of the leakage current. In other embodiments, the second lightly-doped region 24 may also be arranged at a predetermined region adjacent to the first lightly-doped region 22 or the third lightly-doped region 26.

In one embodiment of the present disclosure, a length of the lightly-doped region may be controlled on the basis of requirements on the intensity of an electric field at a channel region of the array substrate or an on-state current (Ion) or off-state current (Ioff) of the TFT (e.g., LTPS TFT), so as to increase an aperture ratio while satisfying the requirement on the characteristic of the channel region of the TFT.

In one embodiment of the present disclosure, the length of the lightly-doped region may be controlled by adjusting types and concentrations of injected ions.

The channel region of the array substrate may be of an N-channel metal oxide semiconductor (NMOS) or a P-channel metal oxide semiconductor (PMOS) structure. For ease of the following description, the array substrate of the NMOS structure may be taken as an example.

The array substrate may be a single-gate or a double-gate array substrate.

Figure 2:
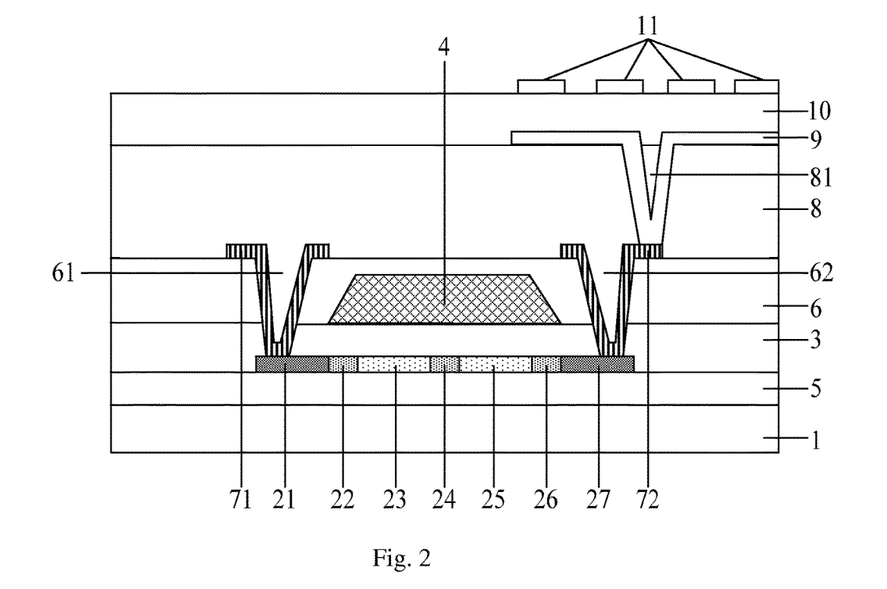
FIG. 2 is a schematic view showing an array substrate according to another embodiment of the present disclosure.

When the array substrate is a single-gate array substrate, as shown in FIG. 1 or 2, a projection of a pattern of the gate electrode layer 4 (i.e., a gate electrode) onto the array substrate may cover projections of the first lightly-doped region 22, the first non-doped region 23, the second lightly-doped region 24, the second non-doped region 25 and the third lightly-doped region 26 onto the array substrate. As a result, a pattern with a small area can be provided while reducing the leakage current, thereby improving the design of the product as well as the pixel per inch (PPI).

Figure 3:
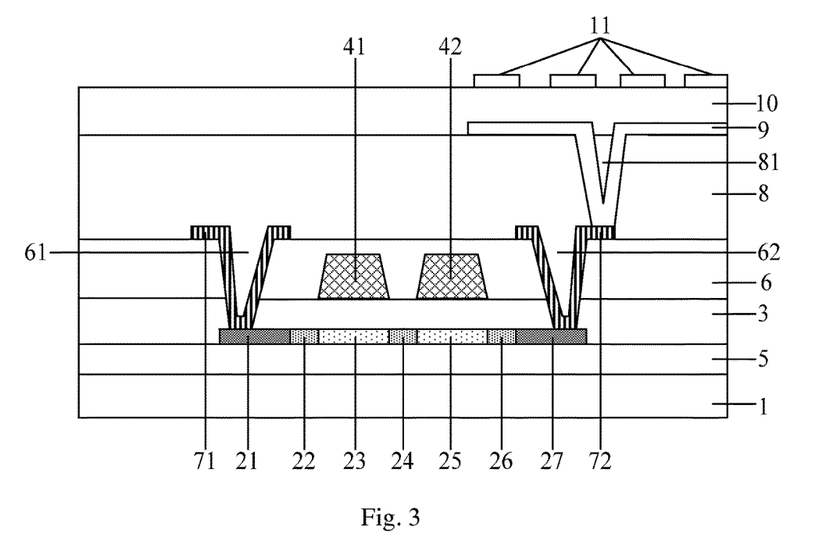
FIG. 3 is a schematic view showing an array substrate according to yet another embodiment of the present disclosure.

When the array substrate is a double-gate array substrate, as shown in FIG. 3, the pattern of the gate electrode layer 4 may include a pattern of a first gate electrode 41 and a pattern of a second gate electrode 42.

In addition, a projection of the pattern of the first gate electrode 41 onto the array substrate may cover a projection of the first non-doped region 23 onto the array substrate; a projection of the pattern of the second gate electrode 42 onto the array substrate may cover a projection of the second non-doped region 25 onto the array substrate. In one embodiment of the present disclosure, since the three lightly-doped regions are arranged at two sides of the two non-doped regions and the middle of the two non-doped regions, respectively, thus, such a structure that the pattern of the gate electrode layer 4 shields the non-doped regions is conductive to accurately control the lengths of the lightly-doped regions during the manufacture.

In one embodiment of the present disclosure, as shown in FIG. 2 or 3, the array substrate may further include a first insulating layer 5 arranged between the base substrate 1 and the active layer. The presence of the first insulating layer 5 may separate the base substrate 1 from the active layer.

In one embodiment of the present disclosure, as shown in FIG. 2 or 3, the array substrate may further include: a second insulating layer 6 arranged on the gate insulating layer 3 and the gate electrode layer 4; and a source-drain electrode layer arranged on the second insulating layer 6. The source-drain electrode layer includes a source electrode line 71 (i.e., a source electrode) and a drain electrode line 72 (i.e., a drain electrode). The source electrode line 71 is electrically connected to the first heavily-doped region 21 through a first via-hole 61 passing through the second insulating layer 6 and the gate insulating layer 3. The drain electrode line 72 is electrically connected to the second heavily-doped region 27 through a second via-hole 62 passing through the second insulating layer 6 and the gate insulating layer 3. In one embodiment of the present disclosure, positions of the source electrode line 71 and the drain electrode line 72 may be replaced with each other.

In one embodiment of the present disclosure, as shown in FIG. 2 or 3, the array substrate may further include: a passivation layer 8 arranged on the source-drain electrode layer and provided with a third via-hole 81; and a pixel electrode layer 9 arranged on the passivation layer 8. The pixel electrode layer 9 is electrically connected to the drain electrode line 72 through the third via-hole 81 in the passivation layer 8.

In another embodiment, as shown in FIG. 2 or 3, the array substrate may further include a protection layer 10 arranged on the passivation layer 8 and the pixel electrode layer 9, and a common electrode layer 11 arranged on the protection layer 10.

In one embodiment of the present disclosure, the lightly-doped regions (including the first lightly-doped region 22, the second lightly-doped region 24 and the third lightly-doped region 26) each may be of a length of about 1 μm to about 3 μm, for example, about 1.5 μm. An ion injection concentration for each of the first lightly-doped region 22, the second lightly-doped region 24 and the third lightly-doped region 26 may be about $5 \times 10^{11}$ ions/cm$^2$ to about $1 \times 10^{14}$ ions/cm$^2$, for example, 10 ions/cm$^2$.

In one embodiment of the present disclosure, an ion injection concentration for each of the first heavily-doped region 21 and the second heavily-doped region 27 may be about $1 \times 10^{14}$ ions/cm$^2$ to about $1.5 \times 10^{20}$ ions/cm$^2$, which belongs to a heavily-doped range. The first heavily-doped region 21 and the second heavily-doped region 27 each may be of a length of about 2 μm to about 5 μm.

Figure 4:
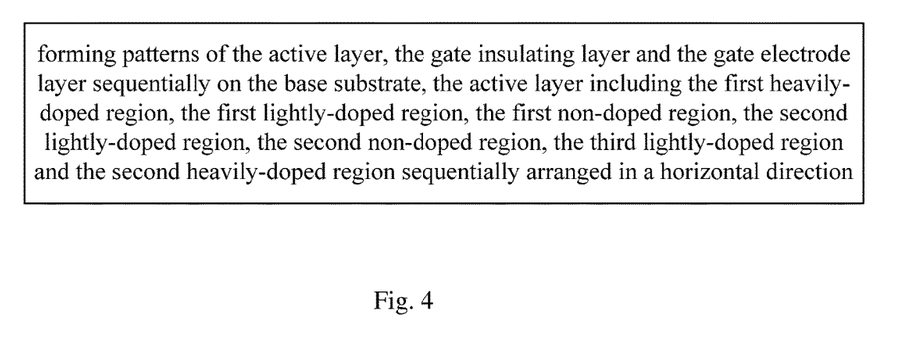
FIG. 4 is a flow chart of a method for manufacturing the array substrate according to one embodiment of the present disclosure.

In order to manufacture the array substrate according to one embodiment of the present disclosure, the present disclosure further provides in one embodiment a method for manufacturing the array substrate. As shown in FIG. 4, the method may include: forming patterns of the active layer, the gate insulating layer 3 and the gate electrode layer 4 sequentially on the base substrate 1, the active layer including the first heavily-doped region 21, the first lightly-doped region 22, the first non-doped region 23, the second lightly-doped region 24, the second non-doped region 25, the third lightly-doped region 26 and the second heavily-doped region 27 sequentially arranged in a horizontal direction.

In one embodiment, the method may further include forming a pattern of the first insulating layer 5 on the base substrate 1.

In one embodiment, the method may further include forming a pattern of the second insulating layer 6 on the gate insulating layer 3 and the gate electrode layer 4; forming the first via-hole 61 and the second via-hole 62 in the second insulating layer 6 and the gate insulating layer 3 in such a manner that the first via-hole 61 is located above the first heavily-doped region 21 and the second via-hole 62 is located above the second heavily-doped region 27; forming the source-drain electrode layer on the second insulating layer 6, the source-drain electrode layer including the source electrode line 71 electrically connected to the first heavily-doped region 21 through the first via-hole 61, and the drain electrode line electrically connected to the second heavily-doped region 27 through the second via-hole 62; forming a pattern of the passivation layer 8 on the source-drain electrode layer, the passivation layer 8 being provided with the third via-hole 81; and forming a pattern of the pixel electrode layer 9 on the passivation layer 8, the pixel electrode layer 9 being electrically connected to the drain electrode line 72 through the third via-hole 81.

In another embodiment, the method may further include forming a pattern of the protection layer 10 on the passivation layer 8 and the pixel electrode layer 9, and forming a pattern of the common electrode layer 11 on the protection layer 10.

The array substrate in the embodiments of the present disclosure may be a single-gate or double-gate array substrate, so the method for manufacturing the array substrate will be described hereinafter by taking the single-gate and double-gate array substrates as an example.

Figure 5:
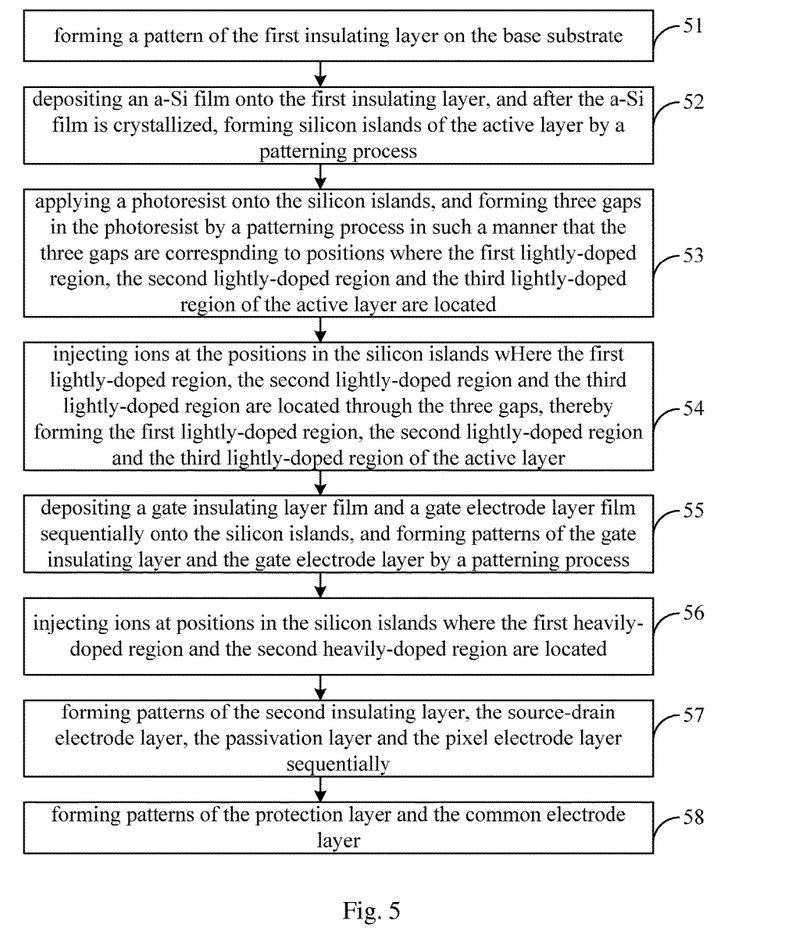
FIG. 5 is a flow chart of a method for manufacturing the array substrate according to another embodiment of the present disclosure.

When the array substrate is a single-gate array substrate, as shown in FIG. 5, the method may include the following steps.

Step 51: forming a pattern of the first insulating layer 5 on the base substrate 1.

The first insulating layer 5 and the second insulating layer 6 involved in one embodiment of the present disclosure may usually be made of SiNx/SiO$_2$ or SiO$_2$, and subjected to dehydrogenation at a high temperature after the deposition, so as to prevent the semiconductor characteristics of the active layer formed thereon from being adversely affected.

Step 52: depositing an a-Si film onto the first insulating layer 5, and after the a-Si film is crystallized, forming silicon islands 2 of the active layer by a patterning process.

To be specific, the a-Si film may be deposited onto the first insulating layer 5, then a poly-Si film may be formed after the crystallization by laser annealing, and then the poly-Si film is subjected to a patterning process (including processes of applying, exposing and developing a photoresist, and an etching process) so as to form the silicon islands 2 of the active layer.

Figure 6:
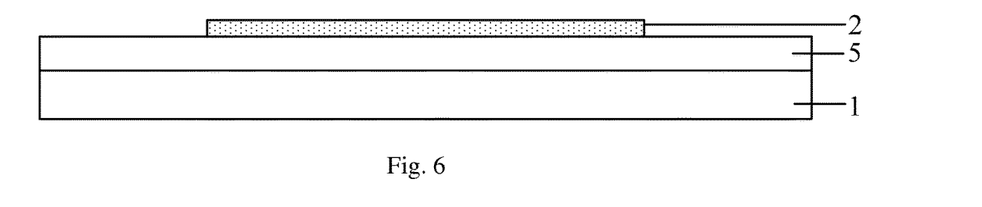
FIG. 6 is a schematic view showing a state of the array substrate when implementing the method for manufacturing the array substrate according to one embodiment of the present disclosure.

FIG. 6 shows the state of the array substrate after Step 52.

Step 53: applying a photoresist (PR) onto the silicon islands 2, and forming a plurality of gaps in the photoresist by a patterning process in such a manner that the plurality of gaps are located above positions where the first lightly-doped region 22, the second lightly-doped region 24 and the third lightly-doped region 26 of the active layer are located.

Step 54: injecting ions at the positions in the silicon islands where the first lightly-doped region 22, the second lightly-doped region 24 and the third lightly-doped region 26 are located through the plurality of gaps, thereby forming the first lightly-doped region 22, the second lightly-doped region 24 and the third lightly-doped region 26 of the active layer.

In one embodiment of the present disclosure, the lightly-doped regions (including the first lightly-doped region 22, the second lightly-doped region 24 and the third lightly-doped region 26) may each be of a length about 1 μm to about 3 μm, e.g., about 1.5 μm. An ion injection concentrate for the lightly-doped regions may be about $5\times10^{11}$ ions/cm$^2$ to about $1\times10^{14}$ ions/cm$^2$.

The ions involved in the embodiments of the present disclosure may be phosphine (PH$_3$) ions.

Figure 7:
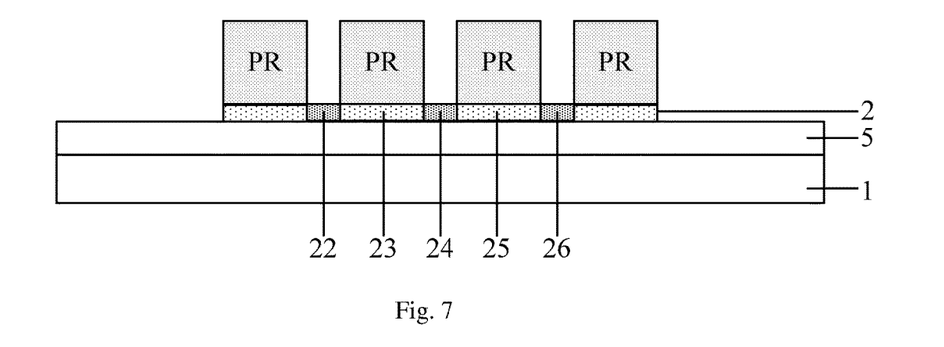
FIG. 7 is a schematic view showing another state of the array substrate when implementing the method for manufacturing the array substrate according to one embodiment of the present disclosure.

In one embodiment of the present disclosure, since the lightly-doped regions and the non-doped regions are arranged alternately and it is unnecessary to inject ions into the non-doped regions, i.e., the doped regions are made of a material identical to the silicon islands, thus, the first non-doped region 23 and the second non-doped region 25 are formed at the same time when the first lightly-doped region 22, the second lightly-doped region 24 and the third lightly-doped region 26 are formed. FIG. 7 shows the state of the array substrate after Step 54.

Step 55: depositing a gate insulating layer film and a gate electrode layer film sequentially onto the silicon islands 2, and forming patterns of the gate insulating layer 3 and the gate electrode layer 4 by a patterning process.

Figure 8:
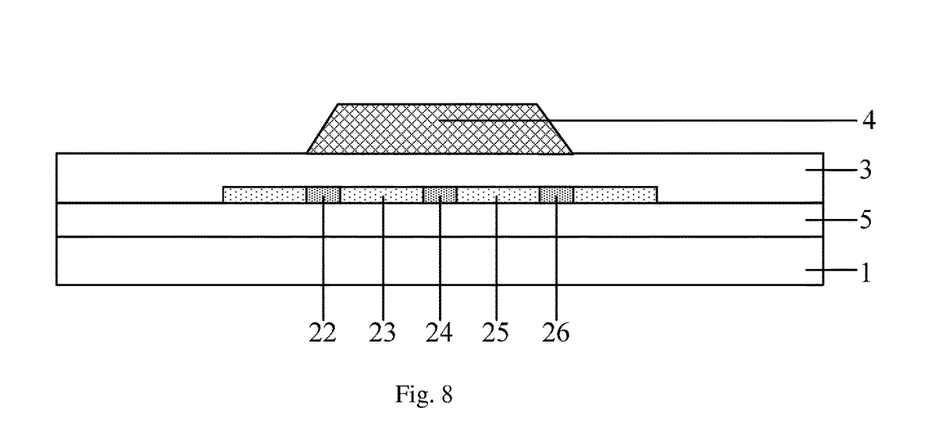
FIG. 8 is a schematic view showing yet another state of the array substrate when implementing the method for manufacturing the array substrate according to one embodiment of the present disclosure.

A projection of the pattern of the gate electrode layer 4 onto the array substrate covers projections of the first lightly-doped region 22, the first non-doped region 23, the second lightly-doped region 24, the second non-doped region 25 and the third lightly-doped region 26 onto the array substrate. To be specific, the patterns of the gate insulating layer 3 and the gate electrode layer 4 may be formed by conventional patterning processes, e.g., applying, exposing, developing and removing processes. FIG. 8 shows the state of the array substrate after Step 55.

Step 56: injecting ions at positions in the silicon islands 2 where the first heavily-doped region 21 and the second heavily-doped region 27 are located, thereby forming the first heavily-doped region 21 and the second heavily-doped region 27 of the active layer.

Figure 9:
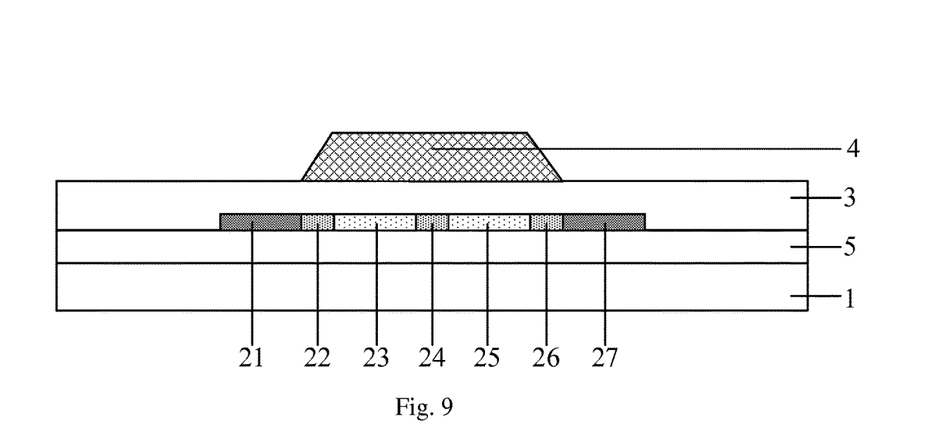
FIG. 9 is a schematic view showing still yet another state of the array substrate when implementing the method for manufacturing the array substrate according to one embodiment of the present disclosure.

In one embodiment of the present disclosure, the heavily-doped regions may each be of an ion injection concentration of about $1\times10^{14}$ ions/cm$^2$ to about $1.5\times10^{20}$ ions/cm$^2$, which belongs to a heavily-doped range. The heavily-doped regions may each have a length identical to that mentioned in the related art. FIG. 9 shows the state of the array substrate after Step 56.

Figure 10:
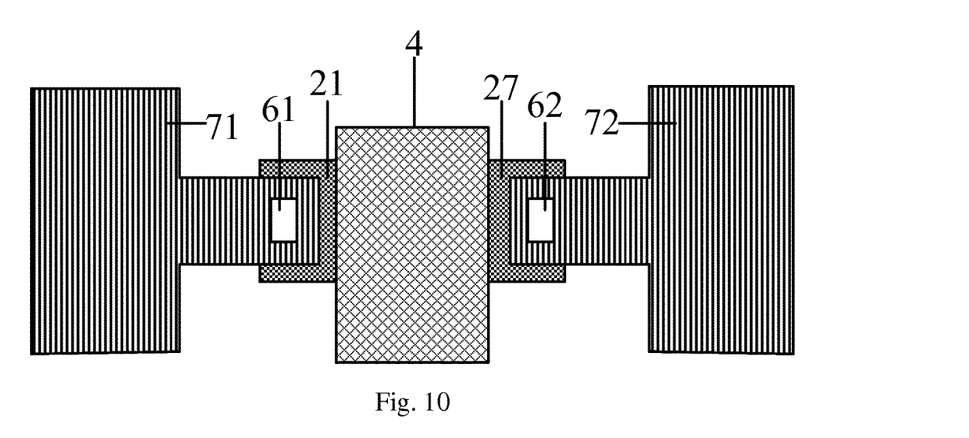
FIG. 10 is a schematic view showing still yet another state of the array substrate when implementing the method for manufacturing the array substrate according to one embodiment of the present disclosure.

Step 57: forming patterns of the second insulating layer 6, the source-drain electrode layer, the passivation layer 8 and the pixel electrode layer 9 sequentially. To be specific, this step may include: forming a pattern of the second insulating layer 6 on the gate insulating layer 3 and the gate electrode layer 4; forming the first via-hole 61 and the second via-hole 62 in the second insulating layer 6 and the gate insulating layer 3 in such a manner that the first via-hole 61 is located above the first heavily-doped region 21 and the second via-hole 62 is located above the second heavily-doped region 27; forming the source-drain electrode layer on the second insulating layer 6, the source-drain electrode layer including the source electrode line 71 electrically connected to the first heavily-doped region 21 through the first via-hole 61, and the drain electrode line 72 electrically connected to the second heavily-doped region 27 through the second via-hole 62 (FIG. 10 (a top view) shows the state of the array substrate); forming a pattern of the passivation layer 8 on the source-drain electrode layer, the pattern of the passivation layer 8 being provided with the third via-hole 81; and forming a pattern of the pixel electrode layer 9 on the passivation layer 8, the pixel electrode layer 9 being electrically connected to the drain electrode line 72 through the third via-hole 81.

In one embodiment of the present disclosure, the patterns and layers may be formed in Step 57 by conventional patterning processes.

Step 58: forming patterns of the protection layer 10 and the common electrode layer 11. To be specific, this step may include: forming the pattern of the protection layer 10 on the passivation layer 8 and the pixel electrode layer 9; and forming the pattern of the common electrode layer 11 on the protection layer 10. In the embodiments of the present disclosure, the patterns and layers may be manufactured at Step 58 by conventional patterning processes.

The single-gate array substrate may be manufactured by the above-mentioned steps, and FIG. 2 shows the resultant array substrate.

Figure 11:
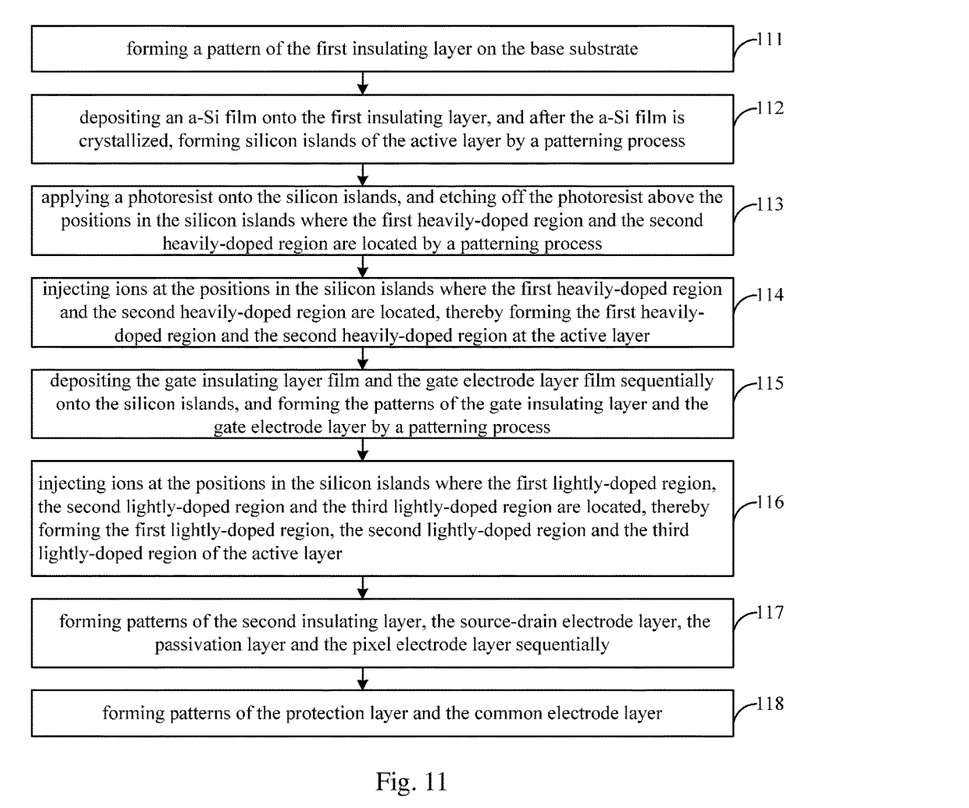
FIG. 11 is a flow chart of a method for manufacturing the array substrate according to yet another embodiment of the present disclosure.

When the array substrate is a double-gate array substrate, as shown in FIG. 11, the method may include the following steps.

Step 111: forming a pattern of the first insulating layer 5 on the base substrate 1. The implementation of this step may be identical to that of the above Step 51.

Step 112: depositing an a-Si film onto the first insulating layer 5, and after the a-Si film is crystallized, forming the silicon islands 2 of the active layer by a patterning process. The implementation of this step may be identical to that of the above Step 52. FIG. 6 shows the state of the array substrate after Step 112.

Step 113: applying a photoresist onto the silicon islands 2, and etching off the photoresist above the positions in the silicon islands 2 where the first heavily-doped region 21 and the second heavily-doped region 27 are located by a patterning process.

Figure 12:
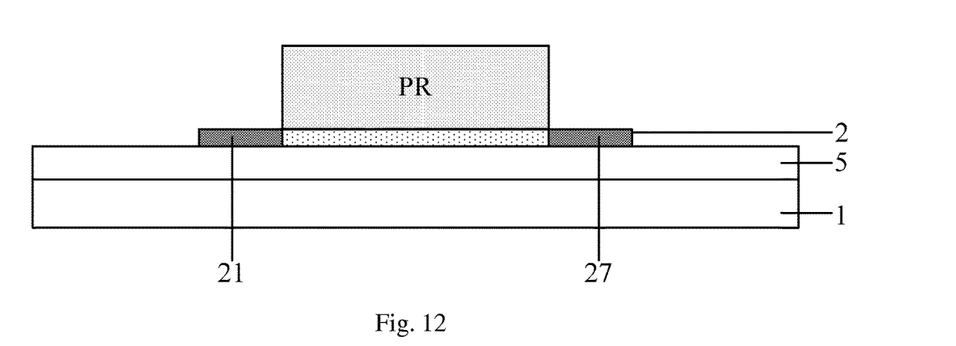
FIG. 12 is a schematic view showing a state of the array substrate when implementing the method for manufacturing the array substrate according to one embodiment of the present disclosure.

Step 114: injecting ions at the positions in the silicon islands 2 where the first heavily-doped region 21 and the second heavily-doped region 27 are located, thereby forming the first heavily-doped region 21 and the second heavily-doped region 27 at the active layer. At this step, phosphine (PH$_3$) ions may be injected at the positions in the silicon islands 2 where the first heavily-doped region 21 and the second heavily-doped region 27 are located, so as to form the first heavily-doped region 21 (N$^+$Si) and the second heavily-doped region 27 (N$^+$Si). FIG. 12 shows the state of the array substrate after Step 114.

Step 115: depositing the gate insulating layer film and the gate electrode layer film sequentially onto the silicon islands 2, and forming the patterns of the gate insulating layer 3 and the gate electrode layer 4 by a patterning process. The pattern of the gate electrode layer 4 includes the pattern of the first gate electrode 41 and the pattern of the second gate electrode 42. A projection of the pattern of the gate electrode 41 onto the array substrate may cover a projection of the first non-doped region 23 onto the array substrate, and a projection of the pattern of the second gate electrode 42 onto the array substrate may cover a protection of the second non-doped region 25 onto the array substrate. In the embodiments of the present disclosure, since the three lightly-doped regions are arranged at two sides of the two non-doped regions and the middle of the two non-doped regions, respectively, thus, such a structure that the pattern of the gate electrode layer shields the non-doped regions is conductive to accurately control positions and widths of the lightly-doped regions during the manufacture.

Figure 13:
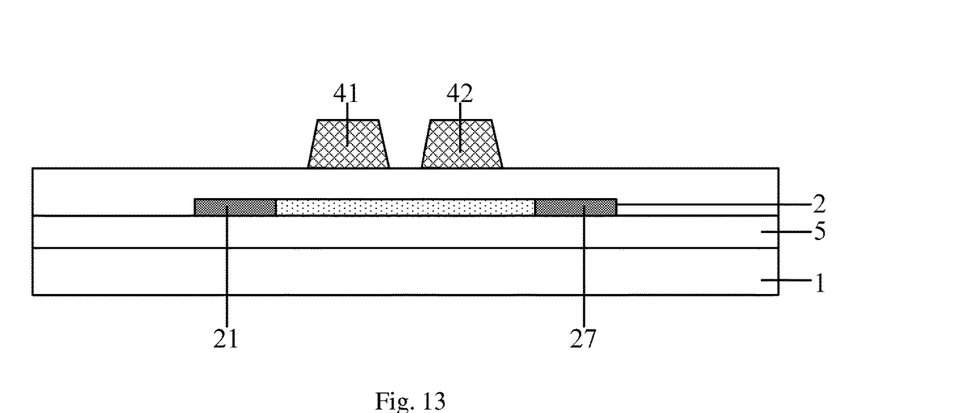
FIG. 13 is a schematic view showing another state of the array substrate when implementing the method for manufacturing the array substrate according to one embodiment of the present disclosure.

To be specific, the patterns of the gate insulating layer 3 and the gate electrode layer 4 may be formed at Step 115 by conventional patterning processes, e.g., applying, exposing, developing and removing processes. The etching process involved in this step may be a dry-etching process. The photoresist with a high resolution may be used, and a phase mask or a wing pattern mask, or a combination thereof may be selected, so as to accurately control a position and a width of the gate electrode layer 4, thereby being conductive to accurately control the positions and widths of the lightly-doped regions. FIG. 13 shows the state of the array substrate after Step 115.

Step 116: injecting ions at the positions in the silicon islands 2 where the first lightly-doped region 22, the second lightly-doped region 24 and the third lightly-doped region 26 are located, thereby forming the first lightly-doped region 22, the second lightly-doped region 24 and the third lightly-doped region 26 of the active layer.

Figure 14:
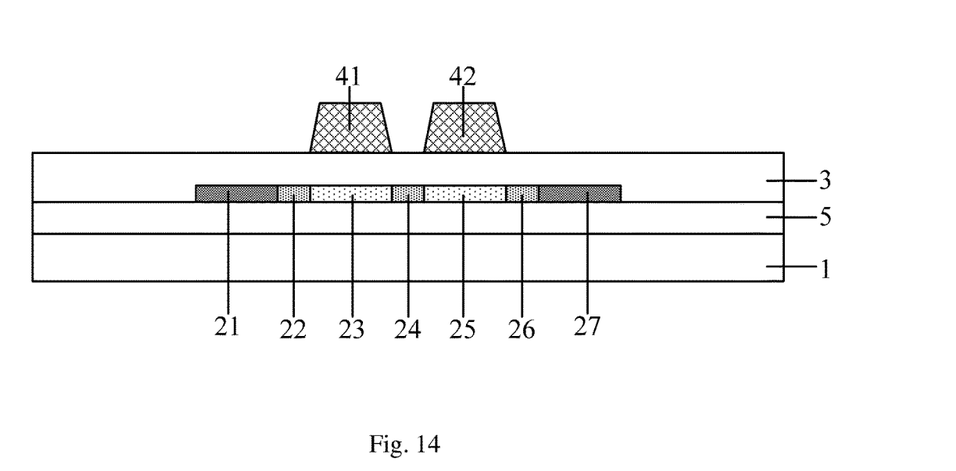
FIG. 14 is a schematic view showing yet another state of the array substrate when implementing the method for manufacturing the array substrate according to one embodiment of the present disclosure.

Since the pattern of the first gate electrode 41 is located above and covers the first non-doped region 23 and the pattern of the second gate electrode 42 is located above and covers the second non-doped region 25, thus, at this step, with the pattern of the formed gate electrode layer 4 as a reference, the ions may be injected into the silicon islands 2 at two sides of the patterns of the first gate electrode 41 and the second gate electrode 42 and therebetween, to form the first lightly-doped region 22, the second lightly-doped region 24 and the third lightly-doped region 26 of the active layer. FIG. 14 shows the state of the array substrate after Step 116.

Figure 15:
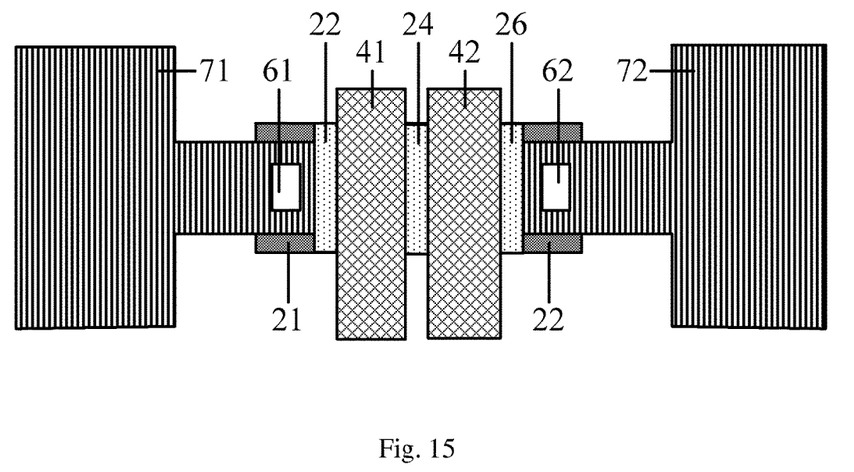
FIG. 15 is a schematic view showing still yet another state of the array substrate when implementing the method for manufacturing the array substrate according to one embodiment of the present disclosure.

Step 117: forming patterns of the second insulating layer 6, the source-drain electrode layer, the passivation layer 8 and the pixel electrode layer 9 sequentially. This step may be identical or similar to Step 57, and FIG. 15 (a top view) shows the state of the array substrate after the source electrode line 71 and the drain electrode line 72 are formed on the second insulating layer 6.

Step 118: forming patterns of the protection layer 10 and the common electrode layer 11. This step may include: forming a pattern of the protection layer 10 on the passivation layer 8 and the pixel electrode layer 9, and forming a pattern of the common electrode layer 11 on the protection layer 10. In the embodiments of the present disclosure, the patterns and layers may be manufactured at Step 118 by conventional patterning processes.

The double-gate array substrate may be manufactured by the above steps, and FIG. 3 shows the resultant array substrate.

In one embodiment of the present disclosure, between Steps 52 and 53, or between Steps 112 and 113, the method may further include subjecting the channel region of the array substrate (i.e., the TFT) to threshold voltage (Vth) doping treatment, i.e., injecting ions of a corresponding type and at a corresponding concentration into the formed silicon islands 2 of the active layer, thereby adjusting the threshold voltage of the channel region of the array substrate.

The present disclosure further provides in one embodiment a display device including the above-mentioned array substrate. The display device may be a liquid crystal panel, a liquid crystal television, a liquid crystal display, an organic light-emitting diode (OLED) panel, an OLED display, a plasma display or an electronic paper.

According to the array substrate, the manufacturing method thereof and the display device in the embodiments of the present disclosure, the active layer, the gate insulating layer and the gate electrode layer are sequentially on the base substrate of the array substrate, and the active layer includes the first heavily-doped region, the first lightly-doped region, the first non-doped region, the second lightly-doped region, the second non-doped region, the third lightly-doped region and the second heavily-doped region sequentially arranged in the horizontal direction. As a result, it is possible to effectively reduce the heat generated by an LTPS TFT and suppress the occurrence of leakage current thereof while ensuring an aperture ratio.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a base substrate, an active layer, a gate insulating layer and a gate electrode layer formed sequentially on the base substrate; wherein the active layer comprises a first heavily-doped region, a first lightly-doped region, a first non-doped region, a second lightly-doped region, a second non-doped region, a third lightly-doped region and a second heavily-doped region which are sequentially arranged in a horizontal direction;

wherein a projection of a pattern of the gate electrode layer onto the array substrate covers projections of the first lightly-doped region, the first non-doped region, the second lightly-doped region, the second non-doped region and the third lightly-doped region onto the array substrate; and wherein the projection of the pattern of the gate electrode layer onto the array substrate only covers the projections of the first lightly-doped region, the first non-doped region, the second lightly-doped region, the second non-doped region and the third lightly-doped region onto the array substrate.

2. The array substrate according to claim 1, wherein the second lightly-doped region is arranged in a middle of the active layer in the horizontal direction.

3. The array substrate according to claim 1, further comprising a first insulating layer arranged between the base substrate and the active layer.

4. The array substrate according to claim 1, further comprising:

a second insulating layer arranged on the gate insulating layer and the gate electrode layer;

a source-drain electrode layer arranged on the second insulating layer; wherein the source-drain electrode layer comprises a source electrode line and a drain electrode line, the source-drain electrode layer is electrically connected to the first heavily-doped region through a first via-hole passing through the second insulating layer and the gate insulating layer, and the drain electrode line is electrically connected to the second heavily-doped region through a second via-hole passing through the second insulating layer and the gate insulating layer;

a passivation layer arranged on the source-drain electrode layer; and a pixel electrode layer arranged on the passivation layer and electrically connected to the drain electrode line through a third via-hole in the passivation layer.

5. The array substrate according to claim 4, further comprising a protection layer arranged on the passivation layer and the pixel electrode layer, and a common electrode layer arranged on the protection layer.

6. The array substrate according to claim 1, wherein the first lightly-doped region, the second lightly-doped region and the third lightly-doped region are each of a length of 1 μm to 3 μm; and an ion injection concentration for each of the first lightly-doped region, the second lightly-doped region and the third lightly-doped region is $5\times10^{11}$ ions/cm$^2$ to $1\times10^{14}$ ions/cm$^2$.

7. The array substrate according to claim 1, wherein an ion injection concentration for each of the first heavily-doped region and the second heavily-doped region is $1\times10^{14}$ ions/cm$^2$ to $1.5\times10^{20}$ ions/cm$^2$; and the first heavily-doped region and the second heavily-doped region are each of a length of 2 μm to 5 μm.

8. A display device comprising the array substrate according to claim 1.

9. A method for manufacturing an array substrate, comprising:

forming patterns of an active layer, a gate insulating layer and a gate electrode layer sequentially on a base substrate; wherein the active layer comprises a first heavily-doped region, a first lightly-doped region, a first non-doped region, a second lightly-doped region, a second non-doped region, a third lightly-doped region and a second heavily-doped region which are sequentially arranged in a horizontal direction;

wherein the step of forming the patterns of the active layer, the gate insulating layer and the gate electrode layer sequentially on the base substrate comprises:

depositing an a-Si film onto the base substrate, and after the a-Si film is crystallized, forming silicon islands of the active layer by a patterning process;

applying a photoresist onto the silicon islands, and forming a plurality of gaps in the photoresist by a patterning process in such a manner that the plurality of gaps are located above positions in the silicon islands where the first lightly-doped region, the second lightly-doped region and the third lightly-doped region are located, respectively;

injecting ions at the positions in the silicon islands where the first lightly-doped region, the second lightly-doped region and the third lightly-doped region are located, respectively, through the plurality of gaps, thereby forming the first lightly-doped region, the second lightly-doped region and the third lightly-doped region of the active layer;

depositing a gate insulating layer film and a gate electrode layer film sequentially onto the silicon islands, and forming the patterns of the gate insulating layer and the gate electrode layer by a patterning process;

wherein a projection of the pattern of the gate electrode layer onto the array substrate covers projections of the first lightly-doped region, the first non-doped region, the second lightly-doped region, the second non-doped region and the third lightly-doped region onto the array substrate, and wherein the projection of the pattern of the gate electrode layer onto the array substrate only covers the projections of the first lightly-doped region, the first non-doped region, the second lightly-doped region, the second non-doped region and the third lightly-doped region onto the array substrate; and injecting ions at positions in the silicon islands where the first heavily-doped region and the second heavily-doped region are located, respectively, thereby forming the first heavily-doped region and the second heavily-doped region of the active layer.

10. The method according to claim 9, wherein the second lightly-doped region is arranged in a middle of the active layer in the horizontal direction.

11. The method according to claim 9, wherein before the step of forming the patterns of the active layer, the gate insulating layer and the gate electrode layer sequentially onto the base substrate, the method further comprises:

forming a pattern of a first insulating layer on the base substrate, the pattern of the active layer being arranged on the first insulating layer.

12. The method according to claim 9, further comprising:

forming a pattern of a second insulating layer on the gate insulating layer and the gate electrode layer;

forming a first via-hole and a second via-hole in the second insulating layer and the gate insulating layer in such a manner that the first via-hole is located above the first heavily-doped region and the second via-hole is located above the second heavily-doped region;

forming a source-drain electrode layer on the second insulating layer in such a manner that the source-drain electrode layer comprises a source electrode line electrically connected to the first heavily-doped region through the first via-hole, and a drain electrode line electrically connected to the second heavily-doped region through the second via-hole;

forming a pattern of a passivation layer on the source-drain electrode layer in such a manner that the pattern of the passivation layer is provided with a third via-hole; and forming a pattern of a pixel electrode layer on the passivation layer in such a manner that the pixel electrode layer is electrically connected to the drain electrode line through the third via-hole.

13. The method according to claim 12, further comprising:

forming a pattern of a protection layer on the passivation layer and the pixel electrode layer; and forming a pattern of a common electrode layer on the protection layer.

14. The method according to claim 9, wherein the first lightly-doped region, the second lightly-doped region and the third lightly-doped region are each of a length of 1 μm to 3 μm; and an ion injection concentration for each of the first lightly-doped region, the second lightly-doped region and the third lightly-doped region is $5\times10^{11}$ ions/cm$^2$ to $1\times10^{14}$ ions/cm$^2$.

15. The method according to claim 9, wherein an ion injection concentration for each of the first heavily-doped region and the second heavily-doped region is $1\times10^{14}$ ions/cm$^2$ to $1.5\times10^{20}$ ions/cm$^2$; and the first heavily-doped region and the second heavily-doped region are each of a length of 2 μm to 5 μm.

* * * * *